(12) United States Patent
Liang et al.

(10) Patent No.: US 11,361,998 B2
(45) Date of Patent: Jun. 14, 2022

(54) METHOD FOR MANUFACTURING AN ELECTRONIC DEVICE

(71) Applicant: InnoLux Corporation, Miao-Li County (TW)

(72) Inventors: I-Chang Liang, Miao-Li County (TW); Chien-Lin Lin, Miao-Li County (TW); Chin-Lung Ting, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 51 days.

(21) Appl. No.: 16/904,659

(22) Filed: Jun. 18, 2020

(65) Prior Publication Data
US 2021/0066127 A1 Mar. 4, 2021

Related U.S. Application Data

(60) Provisional application No. 62/893,868, filed on Aug. 30, 2019.

(51) Int. Cl.
*H01L 21/71* (2006.01)
*H01L 21/78* (2006.01)
*H01L 23/544* (2006.01)

(52) U.S. Cl.
CPC ............ *H01L 21/78* (2013.01); *H01L 23/544* (2013.01); *H01L 2223/5446* (2013.01)

(58) Field of Classification Search
CPC .................................. B23K 26/00; H01L 21/71
See application file for complete search history.

(56) References Cited

U.S. PATENT DOCUMENTS

| 7,871,902 B2* | 1/2011 | Kaltalioglu | ....... H01L 21/31116 438/462 |
| 2007/0009199 A1* | 1/2007 | Yokino | .............. G02B 6/29352 385/14 |
| 2017/0036942 A1 | 2/2017 | Abramov et al. | |

FOREIGN PATENT DOCUMENTS

CN 102256739 A 11/2011

OTHER PUBLICATIONS

Chinese language office action dated Apr. 2, 2022, issued in application No. CN 202010766808.6.

* cited by examiner

*Primary Examiner* — Mohammad M Choudhry
(74) *Attorney, Agent, or Firm* — McClure, Qualey & Rodack, LLP

(57) ABSTRACT

A method for manufacturing an electronic device is provided. The method includes the following steps: providing a first mother substrate including a plurality of first substrate areas; performing a first half-cutting step on the first mother substrate to produce a first crack to define the plurality of first substrate areas; disposing a first optical film on the first mother substrate having the first crack, wherein the first optical film has a first cutting region corresponding to the first crack; performing a first cutting step in the first cutting region of the first optical film; and separating the plurality of first substrate areas to form a plurality of first substrates.

19 Claims, 9 Drawing Sheets

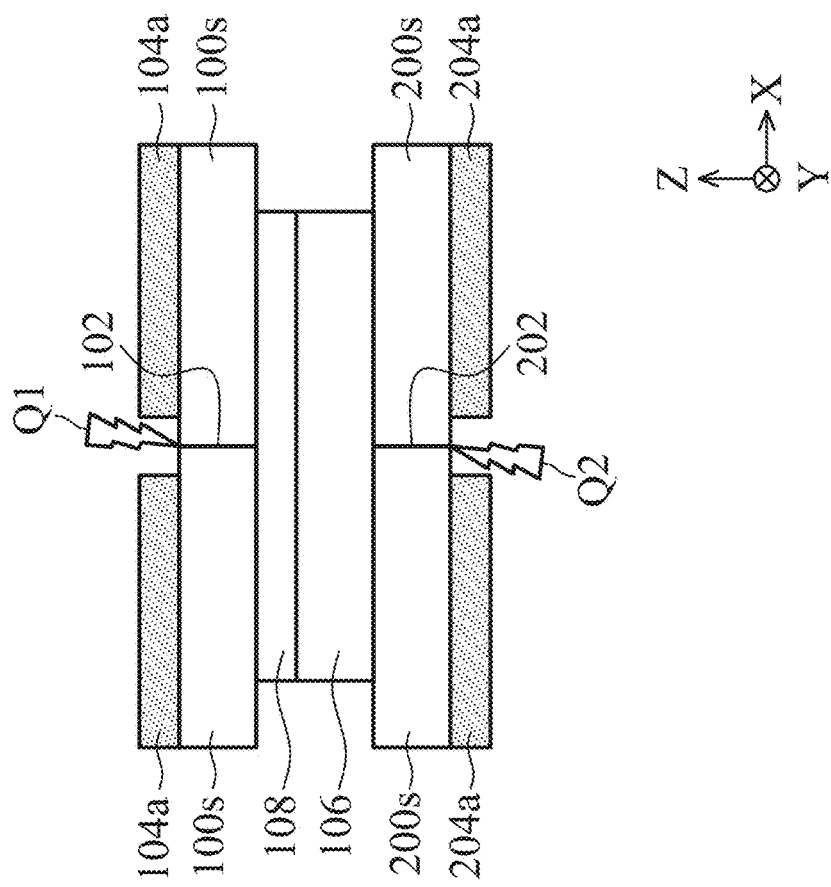
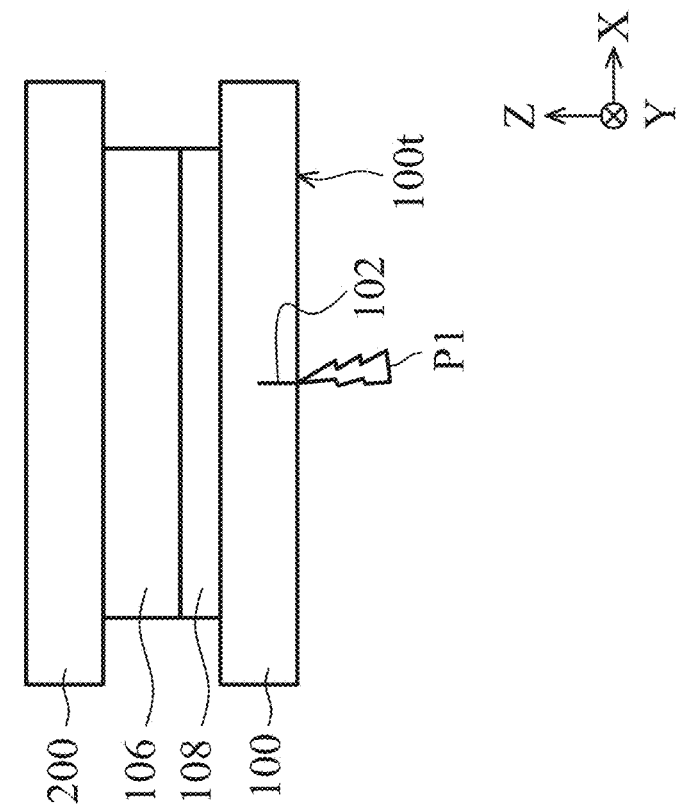
FIG. 3B
FIG. 3A

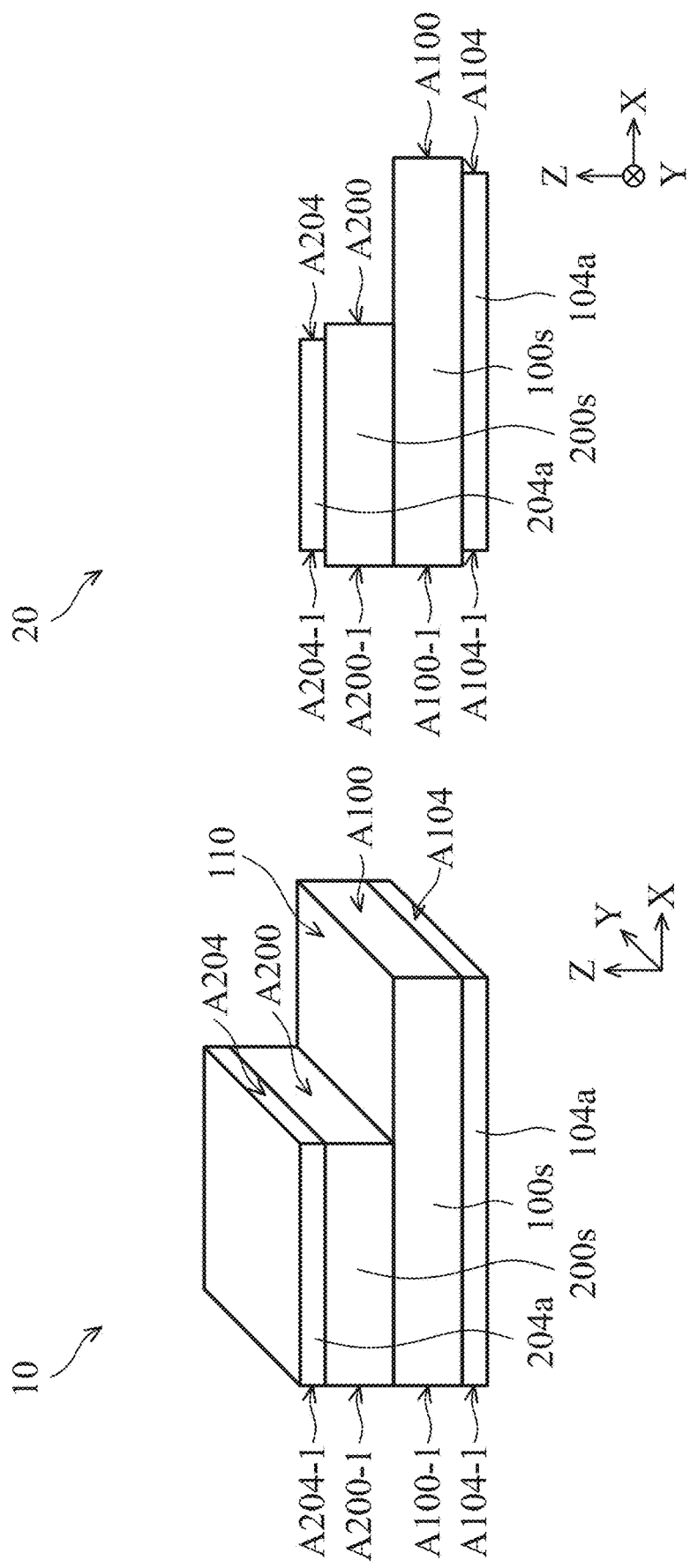

METHOD FOR MANUFACTURING AN ELECTRONIC DEVICE

CROSS REFERENCE TO RELATED APPLICATIONS

This application claims the benefit of U.S. Provisional Application No. 62/893,868, filed on Aug. 30, 2019, the entirety of which is incorporated by reference herein.

BACKGROUND

Technical Field

The present disclosure relates to a method for manufacturing an electronic device.

Description of the Related Art

Electronic devices equipped with panels have become indispensable necessities in modern society. With the flourishing development of these electronic products, consumers have high expectations regarding the quality, functionality, and price of them.

Panels have been widely used in various electronic devices and the method for manufacturing the electronic devices having panels are continuously improved. In most processes, a mother substrate (or panel) may be cut and separated to form a plurality of the substrates (chip cells or panels), and the optical films are individually attached on the substrates (chip cells or panels). However, such a process for attaching the optical films to substrates (chip cells or panels) is time-consuming and cumbersome. In addition, the particles that are generated during the any process may affect the attachment quality of the optical films.

As described above, existing methods for manufacturing an electronic device having a panel have not been satisfactory in all respects. Therefore, improvement of the method for manufacturing such electronic devices is still one of the goals.

SUMMARY

In some embodiments of the present disclosure, a method for manufacturing an electronic device is provided. The method includes the following steps: providing a first mother substrate comprising a plurality of first substrate areas; performing a first half-cutting step on the first mother substrate to produce a first crack to define the plurality of first substrate areas; disposing a first optical film on the first mother substrate having the first crack, wherein the first optical film has a first cutting region corresponding to the first crack; performing a first cutting step in the first cutting region of the first optical film; and separating the plurality of first substrate areas to form a plurality of first substrates.

A detailed description is given in the following embodiments with reference to the accompanying drawings.

BRIEF DESCRIPTION OF THE DRAWINGS

The disclosure may be more fully understood by reading the subsequent detailed description and examples with references made to the accompanying drawings, wherein:

FIG. 3A is a cross-sectional diagram of an electronic device during a part of the manufacturing process in accordance with some embodiments of the present disclosure;

FIG. 3B is a cross-sectional diagram of an electronic device during a part of the manufacturing process in accordance with some embodiments of the present disclosure;

FIG. 8A is a schematic diagram of an electronic device in accordance with some embodiments of the present disclosure;

FIG. 8B is a side-view schematic diagram of an electronic device in accordance with some embodiments of the present disclosure.

DETAILED DESCRIPTION

Figure 1:
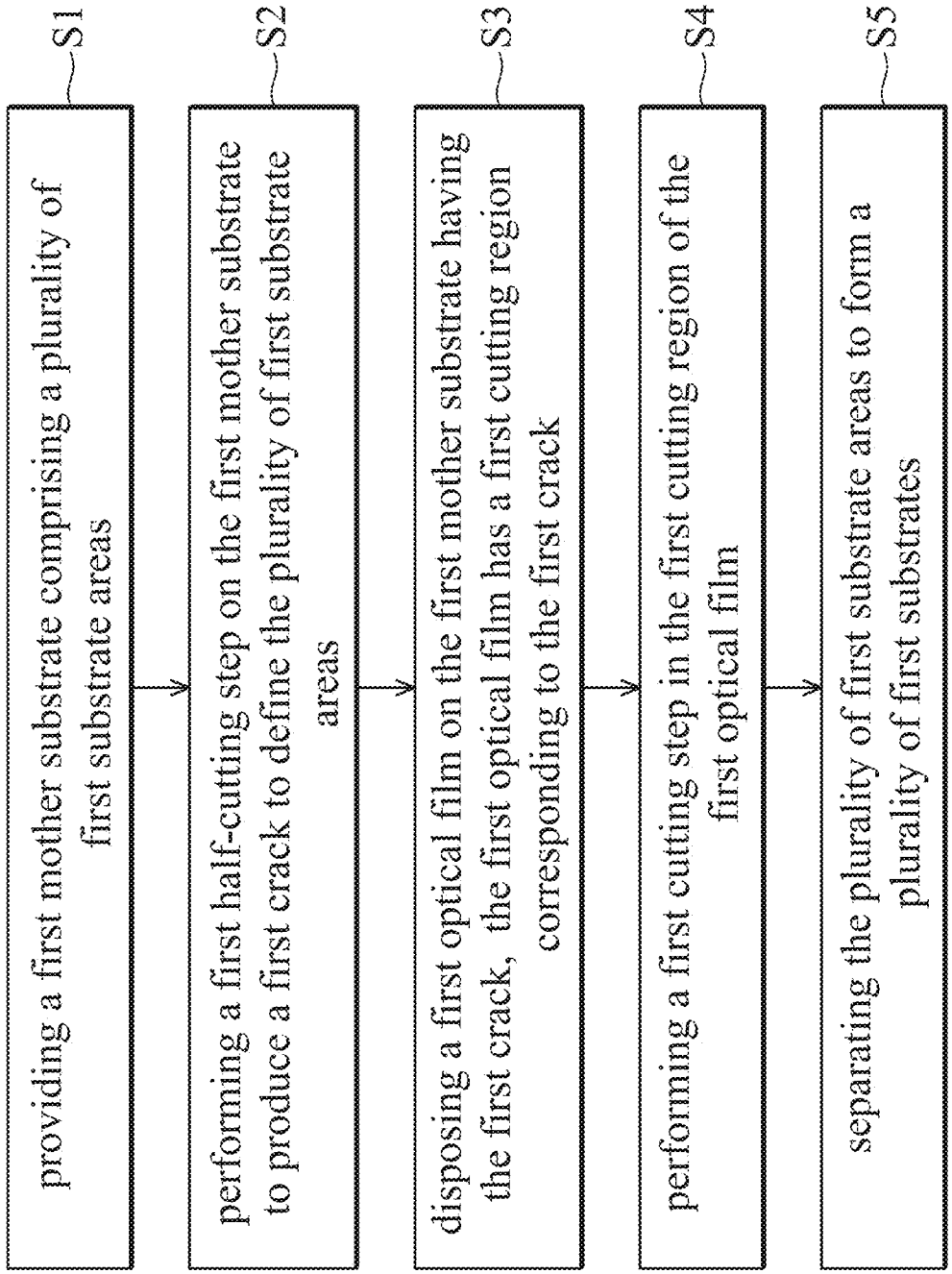
FIG. 1 is a process flow diagram of a method for manufacturing an electronic device in accordance with some embodiments of the present disclosure.

The method for manufacturing an electronic device of the present disclosure is described in detail in the following description. In the following detailed description, for purposes of explanation, numerous specific details and embodiments are set forth in order to provide a thorough understanding of the present disclosure. The specific elements and configurations described in the following detailed description are set forth in order to clearly describe the present disclosure. It will be apparent that the exemplary embodiments set forth herein are used merely for the purpose of illustration. In addition, the drawings of different embodiments may use like and/or corresponding numerals to denote like and/or corresponding elements in order to clearly describe the present disclosure. However, the use of like and/or corresponding numerals in the drawings of different embodiments does not suggest any correlation between different embodiments.

The descriptions of the exemplary embodiments are intended to be read in connection with the accompanying drawings, which are to be considered part of the entire written description. It should be understood that the drawings are not drawn to scale. In fact, the size of the element may be arbitrarily enlarged or reduced in order to clearly express the features of the present disclosure.

In addition, in the embodiments, relative expressions are used. For example, "lower", "bottom", "higher" or "top" are used to describe the position of one element relative to another. It should be appreciated that if a device is flipped upside down, an element that is "lower" will become an element that is "higher". It should be understood that when an element or layer is referred to as being "disposed on" another element or layer, it can be directly disposed on the other element or layer, or intervening elements or layers may be present. In contrast, when an element is referred to as being "directly disposed on" another element or layer, there are no intervening elements or layers present.

It should be understood that, although the terms "first", "second", "third" etc. may be used herein to describe various elements, components, or portions, these elements, components, or portions should not be limited by these terms. These terms are only used to distinguish one element, component, or portion from another element, component, or portion. Thus, a first element, component, or portion discussed below could be termed a second element, component, or portion without departing from the teachings of the present disclosure.

Certain terms are used throughout the description and following claims to refer to particular components. As one skilled in the art will understand, electronic equipment manufacturers may refer to a component by different names. This document does not intend to distinguish between components that differ in name but not function. In the following description and in the claims, the terms "include", "comprise" and "have" are used in an open-ended fashion, and thus should be interpreted to mean "include, but not limited to . . . ". Thus, when the terms "include", "comprise" and/or "have" are used in the description of the present disclosure, the corresponding features, areas, steps, operations and/or components would be pointed to existence, but not limited to the existence of one or a plurality of the corresponding features, areas, steps, operations and/or components.

When an element is referred to as being "disposed on", "attached on" or "formed on" A element, it may be directly disposed on, directly attached on, or directly formed on A element, or may be indirectly disposed on, indirectly attached on, or indirectly formed on A element through other component. In contrast, when an element is referred to as being "disposed (attached or formed) between" A element and B element, it may be directly disposed (attached or formed) between A element and B element, or may be indirectly disposed (attached or formed) between A element and B element through other component.

The terms "about", "substantially", "equal", or "same" generally mean within 20% of a given value or range, or mean within 10%, 5%, 3%, 2%, 1%, or 0.5% of a given value or range. In addition, the phrase "in a range from a first value to a second value" indicates the range includes the first value, the second value, and other values in between.

Unless defined otherwise, all technical and scientific terms used herein have the same meaning as commonly understood by one of ordinary skill in the art to which this disclosure belongs. It should be appreciated that, in each case, the term, which is defined in a commonly used dictionary, should be interpreted as having a meaning that conforms to the relative skills of the present disclosure and the background or the context of the present disclosure, and should not be interpreted in an idealized or overly formal manner unless so defined.

In accordance with some embodiments of the present disclosure, a method for manufacturing an electronic device is provided. The method includes a half-cutting process to the mother substrate and/or a cutting process to the optical film after the half-cutting process, and a plurality of separated substrates with respective optical film portions disposed or attached thereon can be obtained. In some embodiments, the optical film is disposed on or attached on the mother substrate, and then cut the optical film into separated optical film portions that respectively correspond to the separated substrates (or chip cells). Therefore, there is no need to cut the optical film into separated ones in advance and then disposed or attached them on the separated substrates respectively. In some embodiments, the provided method for manufacturing an electronic device can be time-saving or improve the process efficiency. In some embodiments, the optical film is disposed or attached on the mother substrate before the cutting step, the provided method can improve the attachment quality of the optical film.

Refer to FIG. 1 and FIGS. 2A-2E. FIG. 1 is a process flow diagram of a method 10M for manufacturing an electronic device in some embodiments. FIGS. 2A-2E are schematic diagrams of an electronic device 10 during the manufacturing process in some embodiments. In some embodiments, the electronic device 10 shown in FIGS. 2A-2E is formed by the method 10M for manufacturing an electronic device. It should be understood that additional operations may be provided before, during, and/or after the method 10M for manufacturing the electronic device. In accordance with some embodiments, some of the stages (or steps) described below may be replaced or omitted.

Figure 2A:
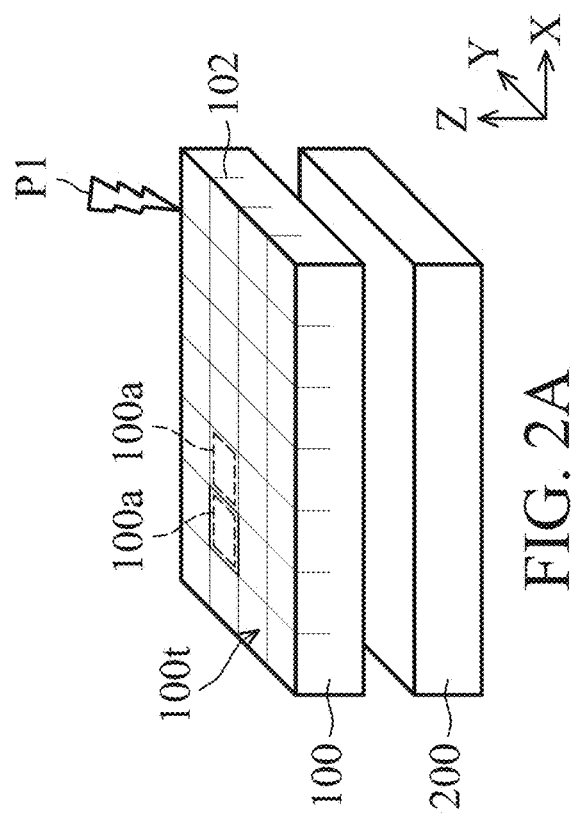
FIGS. 2A-2E are schematic diagrams of an electronic device during the manufacturing process in accordance with some embodiments of the present disclosure.

Refer to FIG. 1 and FIG. 2A, in accordance with some embodiments, the method 10M for manufacturing the electronic device includes step S1, providing a first mother substrate 100 comprising a plurality of first substrate areas 100a (labeled by a line segment) that are connected to each other. In some embodiments, the plurality of first substrate areas 100a may arrange in an array, but it is not limited thereto. In some embodiments, the first substrate areas 100a are the predetermined areas of the first substrate 100s (shown in FIG. 7 or FIG. 8A to FIG. 8B) to be formed.

Figure 2B:
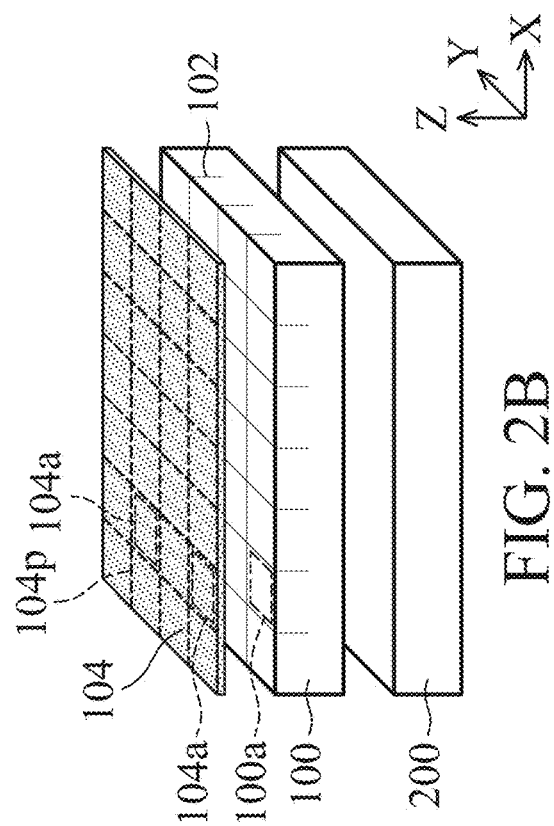
Figure 2C:
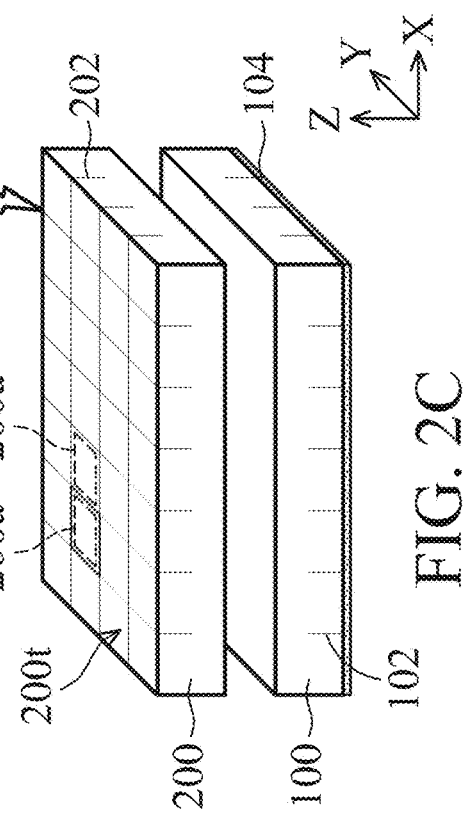

In some embodiments (as shown in FIG. 2C), the method for manufacturing an electronic device further includes providing a second mother substrate 200 disposed opposite to the first mother substrate 100, the second mother substrate 200 comprises a plurality of second substrate areas 200a (labeled by a line segment). In some embodiments, the second substrate areas 200a are the predetermined areas of the second substrate 200s (shown in FIG. 7 or FIG. 8A to FIG. 8B). It should be understood that only the first mother substrate 100 and the second mother substrate 200 are illustrated in FIGS. 2A-2E for clarity. In some embodiments, additional features such as the display medium, the electrode layer, the shielding elements, the spacer elements may be disposed between the first mother substrate 100 and the second mother substrate 200, but it is not limited thereto.

In some embodiments, the first mother substrate 100 and the second mother substrate 200 include a flexible substrate, a rigid substrate or a combination thereof. In some embodiments, the materials of the first mother substrate 100 and/or the second mother substrate 200 may include, but are not limited to, glass, quartz, sapphire, ceramic, polyimide (PI), liquid-crystal polymer (LCP) material, polycarbonate (PC), polyethylene terephthalate (PET), other suitable materials or a combination thereof. In addition, the material of the first mother substrate 100 may be the same as or different from the material of the second mother substrate 200.

In addition, as shown in FIG. 1 and FIG. 2A, in some embodiments, the method 10M includes step S2, performing a first half-cutting step P1 on the first mother substrate 100 to produce a first crack 102 to define the plurality of first substrate areas 100a. The first mother substrate 100 is not cut off by the first crack 102 produced by the first half-cutting step P1. The first crack 102 may have different types produced by the first half-cutting step P1. For example, the first crack 102 may include a plurality of through-holes 102v (shown in FIG. 4A) or a half-depth crack (shown in FIG. 2A or FIG. 5). In some embodiments (FIG. 2A), the first crack 102 may include a half-depth crack, the first crack 102 may extend from a surface 100t of the first mother substrate 100 to a position within the first mother substrate 100, the surface 100t may be a surface of the first mother substrate 100 away from the second mother substrate 200. In some embodiment (not illustrated), the first crack 102 may be located within an interior area (not illustrated) of the first substrate 100. In some embodiment (not illustrated), the first crack 102 may extend from another surface opposite to the surface 100t of the first mother substrate 100 to a position within the first mother substrate 100. The first crack 102 is described in more detail below.

In some embodiments, the first half-cutting step P1 comprises a laser cutting process or a wheel cutting process. In some embodiments, the intensity of laser in a laser cutting process or the cutting depth in a wheel cutting process can be adjusted, and the first mother substrate 100 is not cut off by the first half-cutting step P1.

In some embodiments, a cleaning process may be performed on the first mother substrate 100 before the first half-cutting step P1 is performed.

Next, refer to FIG. 1 and FIG. 2B, in some embodiments, the method OM includes step S3, disposing a first optical film 104 on the first mother substrate 100 having the first crack 102, the first optical film 104 has a first cutting region 104p (labeled by a bold line) approximately corresponding to the first crack 102. In other words, the first crack 102 may approximately overlap with the first cutting region 104p in a normal direction Z of the first mother substrate 100.

In addition, it should be understood that although one first optical film 104 is disposed or attached on the first mother substrate 100 as illustrated in the embodiment shown in FIG. 2B, more than one first optical films 104 may be disposed or attached on the first mother substrate 100 in other embodiments. For example, in some embodiments (not illustrated), more than one first optical films 104 are disposed on or attached on the first mother substrate 100, and each first optical film 104 may correspond to several first substrate areas 100a, and the size of the first optical films 104 may be the same or different from each other. The amount of the first mother substrates 100 may be less than the amount of the first optical films 104. Alternatively, in some embodiments, one first optical film 104 may be disposed on or attached on more than one first mother substrates 100. The amount of the first mother substrates 100 may be greater than the amount of the first optical films 104.

Next, refer to FIG. 2C, in some embodiments, the method OM optionally includes step S1', performing a second half-cutting step P2 on the second mother substrate 200 to produce a second crack 202 to define the second substrate areas 200a. In some embodiments, the second substrate areas 200a are the predetermined areas of the second substrate 200s (shown in FIG. 7).

In some embodiments, the second crack 202 may define the positions of the second substrate areas 200a. Specifically, the second mother substrate 200 is not cut off by the second half-cutting step P2. In some embodiments (shown FIG. 2C), the second crack 202 may extend from a surface 200t of the second mother substrate 200 to a position within the second mother substrate 200, the surface 200t may be a surface of the second mother substrate 200 away from the first mother substrate 100, but it is not limited thereto. In some embodiment (not illustrated), the second crack 202 may be located within an interior area (not illustrated) of the second mother substrate 200. In some embodiment (not illustrated), the second crack 202 may extend from another surface opposite to the surface 200t of the second mother substrate 200 to a position within the second mother substrate 200.

In some embodiments, the second half-cutting step P2 includes a laser cutting process or a wheel cutting process. In some embodiments, the intensity of laser in a laser cutting process or the cutting depth in a wheel cutting process can be adjusted, and the second mother substrate 200 is not cut off by the second half-cutting step P2.

Furthermore, in some embodiments, the step S1' may be performed before the step S3. In other words, the second half-cutting step P2 may be performed on the second mother substrate 200 before the first optical film 104 is disposed on or attached on the first mother substrate 100, but it is not limited thereto.

Figure 2D:
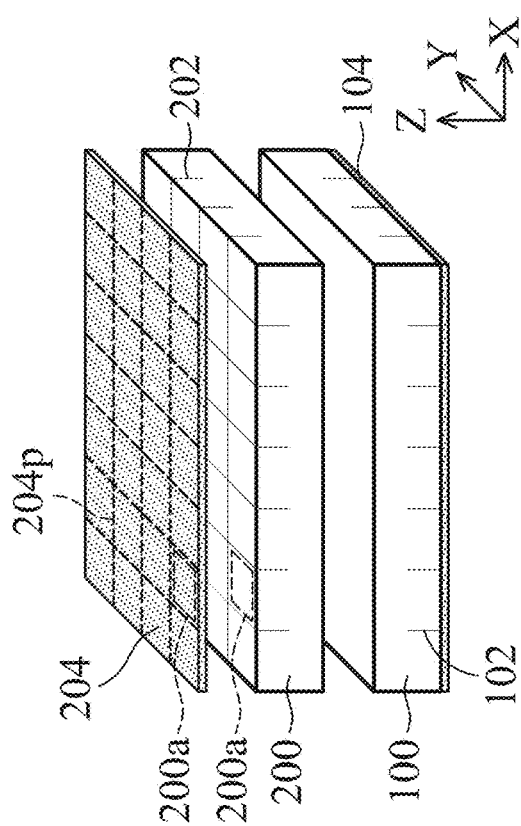

Next, refer to FIG. 2D, in some embodiments, the method OM optionally includes step S2', disposing a second optical film 204 on the second mother substrate 200 having the second crack 202, and the second optical film 204 has a second cutting region 204p (labeled by a line segment) approximately corresponding to the second crack 202. In other words, the second crack 202 may approximately overlap with the second cutting region 204p in the normal direction Z of the first mother substrate 100. In other embodiments, the second mother substrate 200 and/or the second optical film 204 may be omitted.

In some embodiments, the first optical film 104 and/or the second optical film 204 may include a polarizer film, but it is not limited thereto. The material of the first optical film 104 may include polyvinyl alcohol (PVA), or other suitable materials, such as protective layer (such as triacetyl cellulose, TAC), cyclo olefin polymer (COP), polyethylene terephthalate (PET), but it is not limited thereto. For example, in some embodiments, the first optical film 104 and/or the second optical film 204 may include two protective layers and/or a polyvinyl alcohol film interposed between the two protective layers, but it is not limited thereto.

In some embodiments, the first optical film 104 (or the second optical film 204) may be disposed on or attached on the first mother substrate 100 (or second mother substrate 200) by an adhesive element (not illustrated). For example, the adhesive element may include, but is not limited to, a heat-curing glue, a UV-curing glue, a thermoplastic glue, or a combination thereof.

Figure 2E:
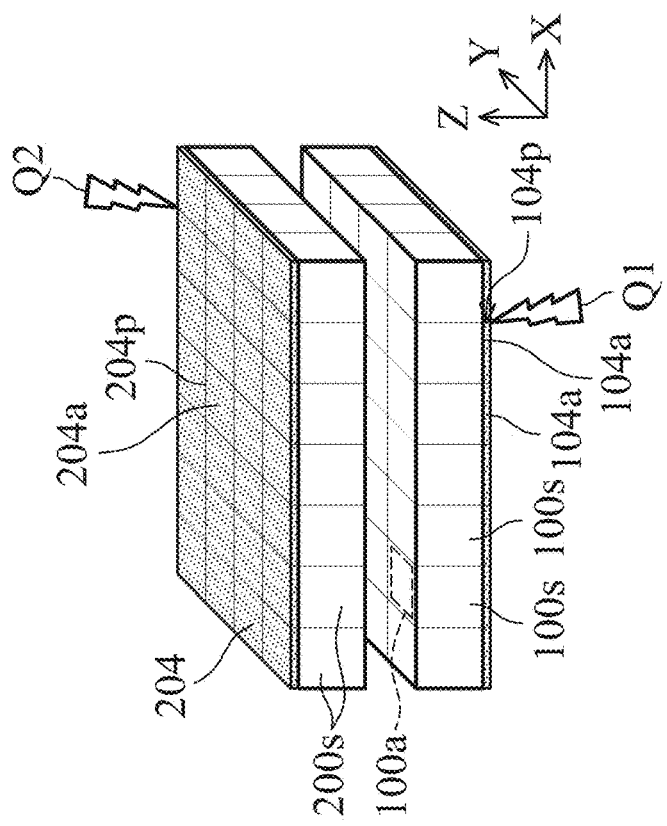

Next, refer to FIG. 1 to FIG. 2E, in some embodiments, the method OM includes step S4, performing a first cutting step Q1 in the first cutting region 104p of the first optical film 104. In some embodiments, the first cutting step Q1 comprises a laser cutting process. Specifically, the laser is used for cutting the first optical film 104 in the first cutting step Q1, the first mother substrate 100 may receive some thermal energy during the first cutting step Q1, and the first crack 102 may extend and/or penetrates through the first mother substrate 100 by the thermal energy, but it is not limited thereto. In other words, the first mother substrate 100 may be cut off in the first cutting step Q1.

However, in some embodiments (shown in FIG. 2E), the second cutting step Q2 may be performed on the second cutting region 204p of the second optical film 204 to cut off the second mother substrate 200. In addition, the second cutting step Q2 may include a laser cutting process.

As shown in FIG. 1 and FIG. 2E, in some embodiments, the method OM includes step S5, after the first cutting step Q1 is performed, separating the first substrate areas 100a to form a plurality of first substrates 100s. In some embodiment, additional mechanical force or ultrasonic force may be used to separate the first substrate areas 100a to form the first substrates 100s, but it is not limited thereto.

In some embodiments, as shown in FIG. 1, FIG. 2D to FIG. 2E, separating the plurality of second substrate areas 200a to form a plurality of second substrates 200s after performing the second cutting step Q2. In other words, the second substrate areas 200a that are connected to each other may also be separated to form a plurality of second substrates 200s after performing the second cutting step Q2. In some embodiment, additional mechanical force or ultrasonic force may be used to separate the second substrate areas 200a to form the second substrates 200s, but it is not limited thereto.

As shown in FIG. 2D to FIG. 2E, it should be understood that although the first substrates 100s and the second substrates 200s illustrated in the drawing all have the same dimension and/or shape, the first substrates 100s and the second substrates 200s may have different dimensions or different shapes in other embodiments. For example, in some embodiments, the shape of one of the first substrate 100s and the shape of one of the second substrates 200s may include, but is not limited to, a rectangle, a polygon, a curved edge shape or an irregular shape. In addition, the shape or dimension of the first substrate 100s may be the same as or different from that of the second substrates 200s. In some other embodiments, the shape or dimension of the first substrates 100s (or the second substrates 200s) may be the same or different, but is not limited thereto.

In some embodiments, the separated first substrate 100s and second substrate 200s and other elements (not illustrated) formed or located between the first substrate 100s and the second substrate 200s may serve as the electronic device 10 or 20 (shown in FIG. 8A or FIG. 8B).

In accordance with some embodiments, the electronic device 10 may include a display device, a sensing device, a light emitting device, an antenna device or a tiled device, but it is not limited thereto. The electronic device 10 may be a bendable, foldable or flexible electronic device. The electronic device 10 may include, for example, a liquid-crystal, light-emitting diodes, such as inorganic light-emitting diodes, organic light-emitting diodes (OLEDs), mini light-emitting diodes (mini LEDs), micro light-emitting diode (micro LED) or quantum dot (QD) light-emitting diode (for example, QLED or QDLED), fluorescence, phosphor, or other suitable materials, or a combination thereof, but it is not limited thereto. The electronic device 10 may be any arrangement and combination described above. It should be understood that in the following description, the display device is taken as an example as the electronic device 10, but the present disclosure is not limited thereto.

Refer to FIG. 3A, which is a cross-sectional diagram of the electronic device 10 during a part of the manufacturing process in accordance with some embodiments of the present disclosure. Specifically, FIG. 3A may correspond to a cross-sectional diagram of a portion of the electronic device 10 as shown in FIG. 2A.

In some embodiments, the first substrate 100s (shown in FIG. 7 or FIG. 8A to FIG. 8B) separated from the first mother substrate 100 may serve as a driving substrate, and the second substrate 200s (shown in FIG. 7 or FIG. 8A to FIG. 8B) separated from the second mother substrate 200 may serve as a color filter substrate, but it is not limited thereto. In some embodiments, the driving substrate may include a driving circuit (not illustrated).

Figure 7:
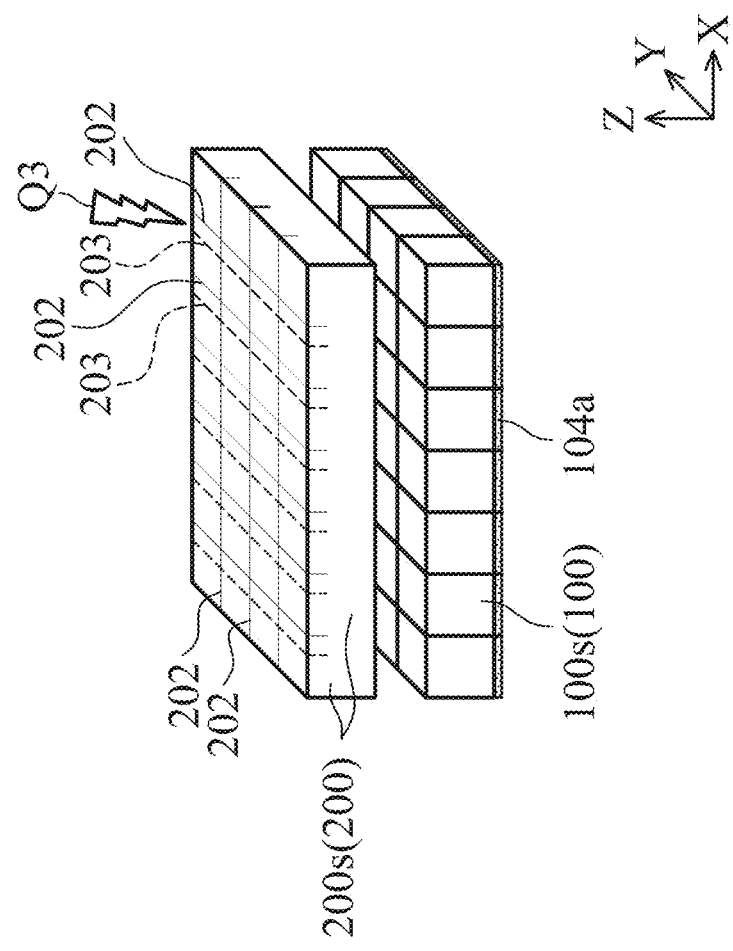
FIG. 7 is a schematic diagram of an electronic device during a part of the manufacturing process in accordance with some embodiments of the present disclosure.

As shown in FIG. 3A, in some embodiments, the spacer element 106 and/or the shielding element 108 may be disposed between the first mother substrate 100 (or the first substrate 100s, shown in FIG. 7) and the second mother substrate 200 (or the second substrate 200s, shown in FIG. 7). In some embodiments, the spacer element 106 and/or the shielding element 108 may be formed or disposed on the first mother substrate 100 or second mother substrate 200.

In some embodiments, the method for manufacturing an electronic device further comprises disposing a spacer element 106 on the first mother substrate 100 before performing the first half-cutting step P1, wherein after performing the first half-cutting step P1, the first crack 102 may overlap with the spacer element 106 in the normal direction Z of the first mother substrate 100. In some embodiments, the method for manufacturing an electronic device further comprises disposing a shielding element 108 on the first mother substrate 100 before performing the first half-cutting step P1, wherein after performing the first half-cutting step P1, the first crack 102 may overlap with the shielding element 108 in the normal direction Z of the first mother substrate 100.

In other words, the first crack 102 formed during the first half-cutting step P1 may overlap with the spacer element 106 in the normal direction Z of the first mother substrate 100. In some embodiments, the first crack 102 formed during the first half-cutting step P1 may overlap with the shielding element 108 in the normal direction Z of the first mother substrate 100.

In addition, as described above, during the first half-cutting step P1, the first crack 102 may extend from the surface 100t of the first mother substrate 100 to a position within the first mother substrate 100. It should be noted that since the position where the first half-cutting step P1 is performed (i.e. the position of the first crack 102) overlaps with the spacer element 106 and/or the shielding element 108, the spacer element 106 and/or the shielding element 108 can protect the second mother substrate 200, the second mother substrate 200 be not cut during the first half-cutting step P1. For example, the spacer element 106 and/or the shielding element 108 can protect the elements formed on the second mother substrate 200 from damage caused by the first half-cutting step P1.

In some embodiments, the spacer element 106 may maintain the cell gap between the first mother substrate 100 and second mother substrate 200, or increase the structural strength of the electronic device 10. In some embodiments, the materials of the spacer element 106 may include organic materials, photo resist, other suitable materials or a combination thereof.

In some embodiments, a color filter layer (not illustrated) may be adjacent to the shielding element 108 and/or partially overlap with the shielding element 108. In some embodiments, the shielding element 108 may have some openings. The color filter layer may overlap with the openings of the shielding element 108. In some embodiments, the shielding element 108 may include black matrix. In some embodiments, the material of the shielding element 108 may include, but is not limited to, black photoresist, black printing ink, black resin, photosensitive material, other suitable materials or a combination thereof, but it is not limited thereto.

Refer to FIG. 3B, which is a cross-sectional diagram of the electronic device 10 during a part of the manufacturing process in accordance with some embodiments of the present disclosure. Specifically, FIG. 3B may correspond to a cross-sectional diagram of a portion of the electronic device 10 as shown in FIG. 2E.

As shown in FIG. 3B, in some embodiments, after the first cutting step Q1 is performed, the first optical film 104 is separated or cut into a plurality of first film portions 104a, and the first film portions 104a may be correspondingly disposed on the first substrates 100s. In some embodiments, the second optical film 204 is separated or cut into a plurality of second film portions 204a by the second cutting step Q2.

Figure 4B:
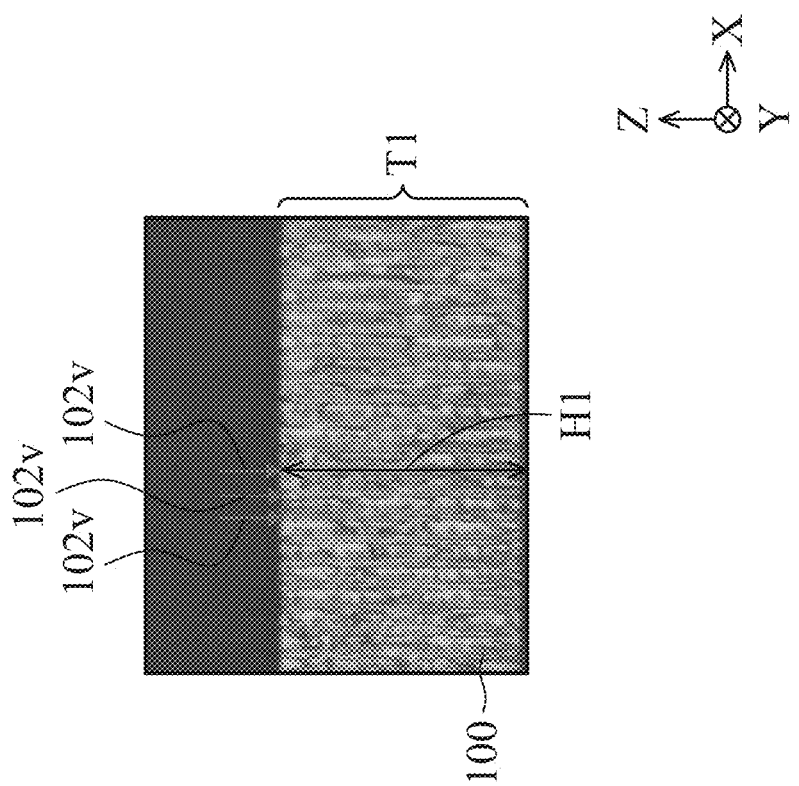
FIG. 4B is a cross-sectional image of a portion of an electronic device during performing a half-cutting step in accordance with some embodiments of the present disclosure.
Figure 4A:
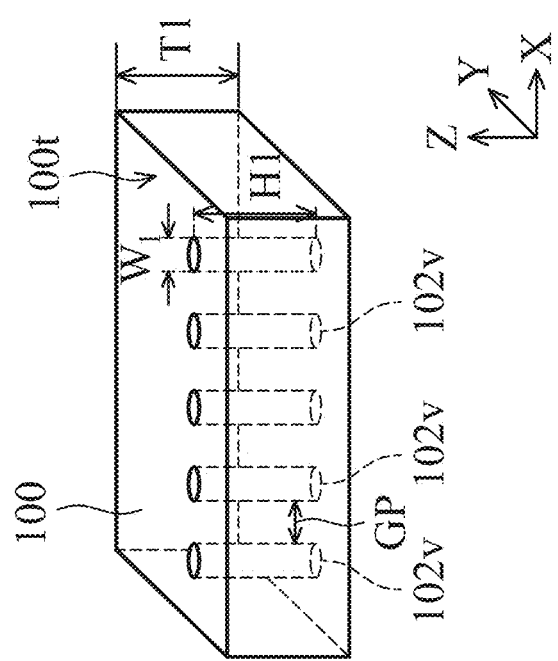
FIG. 4A is a schematic diagram of a portion of an electronic device during performing a half-cutting step in accordance with some embodiments of the present disclosure.

Refer to FIG. 4A, which is a schematic diagram of a portion of the electronic device 10 performing a half-cutting step in accordance with some embodiments of the present disclosure.

As shown in FIG. 4A, in accordance with some embodiments, the first crack 102 may include a plurality of through-holes 102v. The through-holes 102v may penetrate through the first mother substrate 100. In some embodiments, the first half-cutting step P1 may be performed to form the through-holes 102v in the first mother substrate 100.

Specifically, in some embodiments, there is a gap GP between two adjacent ones of the plurality of through-holes 102v. The gap GP is defined by a minimal gap between two adjacent ones of the plurality of through-holes 102v. In some embodiments, the gap GP between two adjacent ones of the plurality of the through-holes 102v may be in a range from 0.5 micrometers (m) to 20 micrometers (0.5 μm≤gap GP≤20 μm), or from 1 μm to 15 μm (1 μm≤gap GP≤15 μm) or from 1 μm to 10 μm (1 μm≤gap GP≤10 μm), but it is not limited thereto. For example, 2 μm, 3 μm, 4 μm, 5 μm, 6 μm, 7 μm, 8 μm or 9 μm. In some embodiments, a width $W_1$ of one of the plurality of the through-hole 102v may be in a range from 0.5 μm to 4 μm (0.5 μm≤width $W_1$≤4 μm), or from 1 μm to 3.5 μm (1 μm≤width $W_1$≤3.5 μm), or from 2 μm to 3.5 μm (2 μm≤width $W_1$≤3.5 μm), but it is not limited thereto. For example, 1.5 μm, 2 μm, 2.5 μm, or 3 μm. The width $W_1$ is defined by a maximum width of the through-hole 102v. In some embodiments, a height $H_1$ of the through-hole 102v may be substantially the same as a thickness T1 of the first mother substrate 100.

It should be noted that, if the gap GP between the through-holes 102v is too large, the following first cutting step Q1 may not be able to cut off the first mother substrate 100. On the other hand, if the gap GP between the through-holes 102v is too small, the first mother substrate 100 may be entirely cut off in the first half-cutting step P1 and/or thus fail to perform the first half-cutting step P1.

In these embodiments, the through-holes 102v may be formed by a laser cutting process, but it is not limited thereto. The gap GP between the through-holes 102v may be controlled by adjustment of the laser beam pitch.

In accordance with the embodiments of the present disclosure, an optical microscopy (OM), a scanning electron microscope (SEM), a film thickness profiler (α-step), an ellipsometer or another suitable means may be used to measure the width, height, thickness or length of the elements, or distance between the elements, but the present disclosure is not limited thereto. Specifically, in some embodiments, a scanning electron microscope may be used to obtain a cross-sectional image of the structure, and a suitable instrument may be used to measure the width, height, thickness, gap or length of the elements, or distance between the elements in the image.

In addition, in some embodiments, the second mother substrate 200 may include the through-holes that penetrate through the second mother substrate 200. Refer to FIG. 4B, which is a cross-sectional image of a portion of the electronic device 10 during performing a half-cutting step P1 in some embodiments.

As shown in FIG. 4B, several through-holes 102v are formed in the first mother substrate 100 or the second mother substrate 200, and the through-holes 102v penetrate through the first mother substrate 100 or the second mother substrate 200. The height H1 of the through-hole 102v is substantially the same as the thickness T1 of the first mother substrate 100 or the second mother substrate 200.

Figure 5:
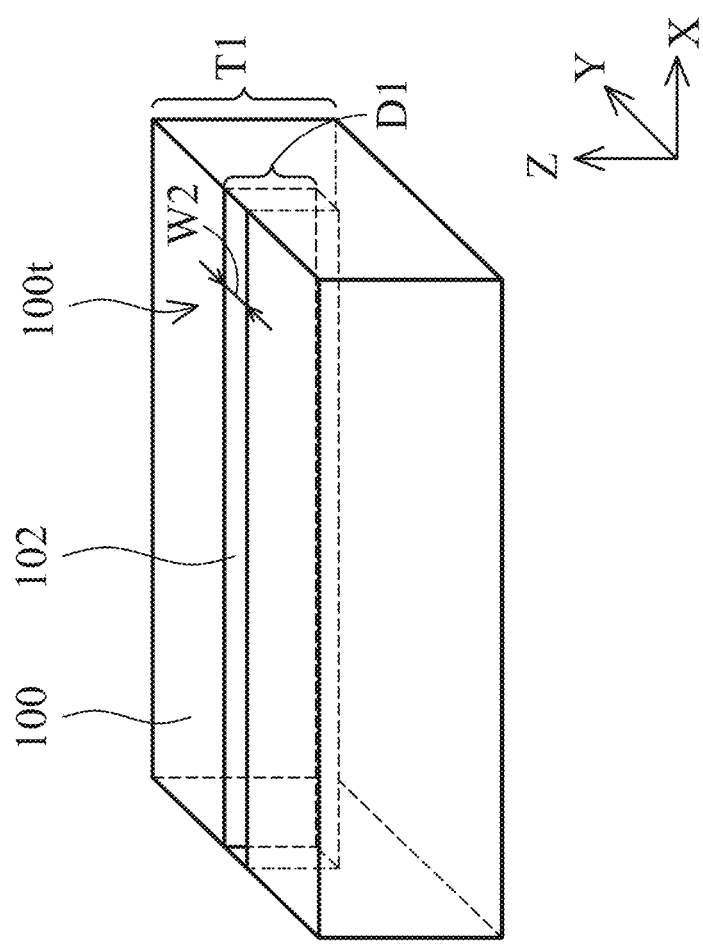
FIG. 5 is a schematic diagram of a portion of an electronic device during performing a half-cutting step in accordance with some embodiments of the present disclosure.

Refer to FIG. 5, which is a schematic diagram of a portion of the electronic device 10 during performing a half-cutting step P1 in accordance with some other embodiments of the present disclosure.

As shown in FIG. 5, in some embodiments, the first crack 102 is formed by partially cutting the first mother substrate 100. In these embodiments, the first crack 102 may form and extend from the top surface 100t of the first mother substrate 100 to the interior area 100m of the first mother substrate 100, but it is not limited thereto. In some embodiments, the first crack 102 has a depth D1 and a width W2. In some embodiments, the depth D1 of the first crack 102 is smaller than the thickness T1 of the first mother substrate 100. The depth D1 of the first crack 102 is defined by a maximum depth of the first crack 102 from a cross-section image (for example, a SEM image) approximately perpendicular to an extending direction of the first crack 102. The width W2 of the first crack 102 is defined by a maximum width of the first crack 102 from a cross-section image (for example, a SEM image) approximately perpendicular to the extending direction of the first crack 102. The thickness T1 of the first mother substrate 100 is defined by a maximum thickness of the first mother substrate 100.

In some embodiments, a ratio of the depth D1 of the first crack 102 to the thickness T1 of the first mother substrate 100 may be in a range from 0.2 to 0.8 (0.2≤D1/T1≤0.8), or from 0.3 to 0.7 (0.3≤D1/T1≤0.7), or 0.35 to 0.65 (0.35≤D1/T1≤0.65), but it is not limited thereto. For example, a ratio (D1/T1) may be 0.4, 0.5 or 0.6. In some embodiments, the width W2 of the first crack 102 may be in a range from 0.5 μm to 4 μm (0.5 μm≤width W2≤4 μm), or from 1 μm to 3.5 μm (1 μm≤width W2≤3.5 μm), or from 2 μm to 3.5 μm (2 μm≤width W2≤3.5 μm), but it is not limited thereto. For example, the width W2 may be 1.5 μm, 2 μm, 2.5 μm or 3 μm.

It should be noted that if the ratio D1/T1 is too small, the following first cutting step Q1 may not be able to cut off the first mother substrate 100. On the other hand, if the ratio D1/T1 is too large, the first mother substrate 100 may be entirely cut off in the first half-cutting step P1 and thus fail to carry out the first half-cutting step P1.

In these embodiments, the first crack 102 may be formed by a laser cutting process or a wheel cutting process, but it is not limited thereto. The depth $D_1$ of the first crack 102 may be controlled by adjustment of dimension of the wheel cutter, the laser beam energy and/or laser type, but it is not limited thereto.

Figure 6B:
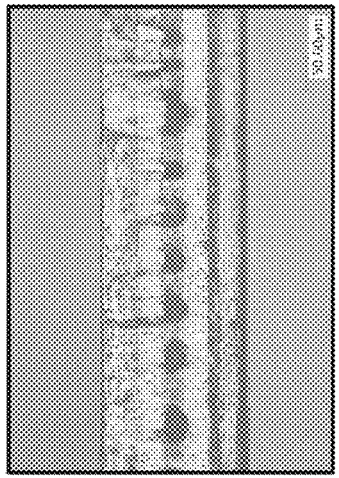
FIG. 6B is a side-view image of a portion of an electronic device in accordance with some embodiments of the present disclosure.
Figure 6B:
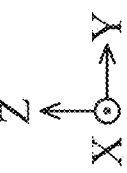
Figure 6C:
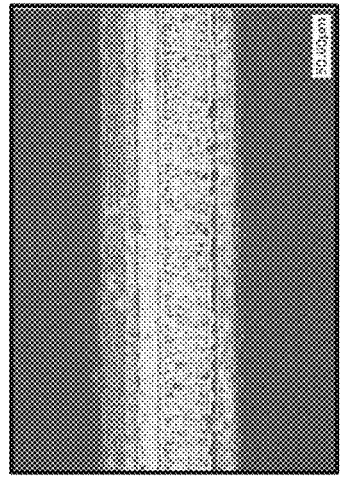
FIG. 6C is a side-view image of a portion of an electronic device in accordance with some embodiments of the present disclosure.
Figure 6C:
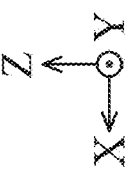
Figure 6A:
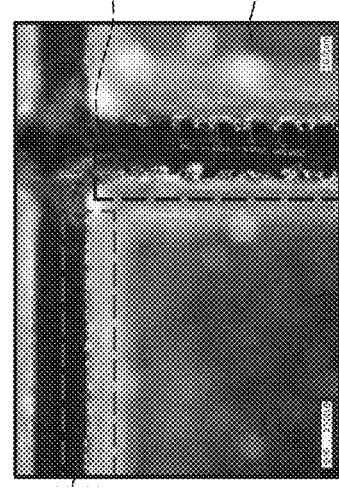
FIG. 6A is a top-view image of a portion of an electronic device in accordance with some embodiments of the present disclosure.
Figure 6A:
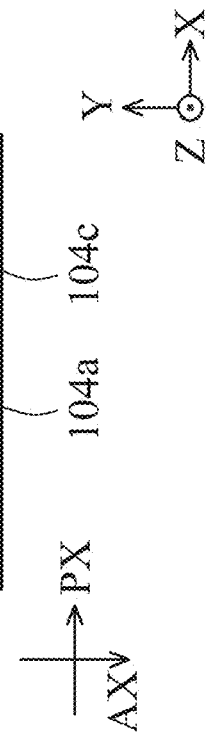

Refer to FIG. 6A, which is a top-view image of a portion of an electronic device in accordance with some embodiments of the present disclosure. Specifically, FIG. 6A is a top-view image of the first film portions 104a obtained by an optical microscopy after the first cutting step Q1 in some embodiments.

As shown in FIG. 6A, after performing the first cutting step Q1, the first optical film 104 is separated into a plurality of first film portions 104a, the plurality of first film portions 104a are correspondingly disposed on the plurality of first substrates 100s. At least one of first film portions 104a has a penetration axis PX and an absorption axis AX (as indicated by arrows in the drawing). In some embodiments, a first cross-section A1 of the at least one of the first film portion 104a that is non-parallel to the penetration axis PX has a convex-concave structure 104c. In some embodiments, the first cross-section A1 of the at least one of the first film portion 104a that is approximately parallel to the absorption axis AX has a convex-concave structure 104c. In some embodiments, the first cross-section A1 of the at least one of the first film portion 104a that is approximately perpendicular to the penetration axis PX has the convex-concave structure 104c.

In some embodiments, a second cross-section A2 of the first film portion 104a that is approximately parallel to the penetration axis PX may have a smoother surface than the first cross-section A1 of the first film portion 104a that is non-parallel or approximately perpendicular to the penetration axis PX. In some embodiments, the roughness of the first cross-section A1 of the at least one of the first film portion 104a that is non-parallel or approximately perpendicular to the penetration axis PX is greater than the roughness of the second cross-section A2 of the at least one of the first film portion 104a that is approximately parallel to the penetration axis PX.

More specifically, refer to FIG. 6B and FIG. 6C. FIG. 6B is a side-view image of the first cross-section A1 shown in FIG. 6A in accordance with some embodiments of the present disclosure. FIG. 6C is a side-view image of the second cross-section A2 shown in FIG. 6A in accordance with some embodiments of the present disclosure.

As shown in FIG. 6B and FIG. 6C, the first film portion 104a has a multilayer structure. As shown in FIG. 6B, the first cross-section A1 of the first film portion 104a that is non-parallel to the direction of the penetration axis PX has several dark-colored dots, which may be generated because some deformation texture. In other words, the texture or morphology of the first cross-section A1 is not uniform. Furthermore, as shown in FIG. 6C, the second cross-section A2 of the first film portion 104a that is approximately parallel to the direction of the penetration axis PX does not have the dark-colored grains and/or the texture of the second cross-section A2 is more uniform.

Next, refer to FIG. 7, which is a schematic diagram of the electronic device 10 during the manufacturing process in accordance with some embodiments of the present disclosure. In some embodiments, the method 10M may optionally include performing a third cutting step Q3 (such as a half cutting step or a full cutting step) on the second mother substrate 200 to produce a third crack 203 (dotted line). In some embodiments, the third crack 203 dose not overlap with the second crack 202. In some embodiments, the third crack 203 is adjacent to the second crack 202.

In some embodiments, the third crack 203 of the second mother substrate 200 may overlap with an outer lead bonding (OLB) area 110 (shown in FIG. 8A) in the normal direction Z of the first mother substrate 100.

In some embodiments, the third cutting step Q3 includes a wheel cutting process. Specifically, the bonding area 110 includes many metallic circuits thereon, the cutting step using laser easily melt the metallic circuits and/or damage the circuits. Therefore, the third cutting step Q3 using the wheel cutting process can decrease the risk of damaging the circuits on bonding area 110, but it is not limited thereto. In some embodiments, the third cutting step Q3 may use the laser cutting process.

In some embodiments (not illustrated), after performing the third cutting step Q3 and the abovementioned second cutting step Q2, the second optical film 204 may be disposed on the second mother substrate 200, and the second optical film 204 may has a the fourth cutting region (not illustrated) corresponding to the third crack 203 and a second cutting region 204p corresponding to the second crack 202. In some embodiments, after disposing the second optical film 204 on the second mother substrate 200 having the second crack 202 and/or the third crack 203, then performing a second cutting step Q2 corresponding to the second crack 202 and/or a fourth cutting step Q4 (not illustrated) corresponding to the third crack 203 to cut off the second optical film 204. In some embodiments, the fourth cutting step Q4 and second cutting step Q2 may use the same cutting method or different methods.

Refer to FIG. 8A and FIG. 8B. FIG. 8A is a schematic diagram of the electronic device 10 in some embodiments of the present disclosure. FIG. 8B is a side-view diagram of the electronic device 10 in some embodiments. Specifically, FIG. 8A and FIG. 8B illustrate the structures of the first substrate 100s and/or the first optical film 104 after the first cutting step Q1 is performed, and the structures of second substrate 200s and/or the second optical film 204 after the second cutting step Q2 and/or fourth cutting step Q4 are performed.

As shown in FIG. 8A, in some embodiments, after performing the first cutting step Q1, the first optical film 104 is separated into the plurality of first film portions 104a, and the plurality of first film portions 104a are respectively and correspondingly disposed on the plurality of first substrates 100s In some embodiments, in a normal direction Z of the first substrate 100s, a side surface A104 of at least one of the plurality of first film portion 104a may be approximately aligned with a side surface A100 of a corresponding one of the first substrate 100s, but it is not limited thereto.

In some embodiments, after the second cutting step Q2 and/or fourth cutting step Q4 are performed, the second optical film 204 is separated into the plurality of second film portions 204a, and the plurality of second film portions 204a are respectively and correspondingly disposed on the second substrate 200s. In some embodiments, in the normal direction Z of the first mother substrate 100 (or the first substrate 100s), a side surface A204 of the second film portion 204a may be approximately aligned with a side surface A200 of a corresponding second substrate 200s of the plurality of second substrates 200s.

In some embodiments, the roughness of the side surface A100 of the first substrate 100s may be greater than the side surface A200 of the second substrate 200s. In some embodiments, the roughness of the side surface A100 of the first substrate 100s may be in a range from 0.5 μm to 2 μm (i.e. 0.5 μm≤roughness≤2 μm), or from 0.8 μm to 1.5 μm (0.8 μm≤roughness≤1.5 μm0, or from 1 μm to 1.5 μm (1 μm≤roughness≤1.5 μm), but it is not limited thereto. In some embodiments, the roughness of the side surface A200 of the second substrate 200s may be less than 0.8 μm (roughness≤0.8 μm) or less than 0.5 μm (roughness≤0.5 μm), but it is not limited thereto.

In some embodiments, a side surface A100 (or a side surface A100-1) of the first substrate 100s correspond to a position of the first crack 102 formed by the first half-cutting step P1, a side surface A200 of the second substrate 200s correspond to a position of the third crack 203 formed by the third cutting step Q3, and a side surface A200-1 of the second substrate 200s correspond to a position of the second crack 202 formed by the second half-cutting step P2. In some embodiments, a side surface A104 (or a side surface A104-1) of the first film portion 104a correspond to a position of the first cutting region 104p formed by the first cutting step Q1, a side surface A204 of the second film portion 204a correspond to a position of the fourth cutting region (not illustrated) formed by the fourth cutting step Q4 (not illustrated), a side surface A204-1 of the second film portion 204a correspond to a position of the second cutting region 204p formed by the second cutting step Q2.

In some embodiments (shown in FIG. 8A or FIG. 8B), removing a portion of the second substrate 200s and/or a portion of the second film portion 204a may expose the bonding area 110 of the first substrate 100s.

As shown in FIG. 8B, in other embodiments, in the normal direction Z of the first mother substrate 100 (or the first substrate 100s), the side surface A100 of the first substrate 100s may protrude from the side surface A104 of the corresponding first film portion 104a, but it is not limited thereto. In some other embodiments, in the normal direction Z of the first mother substrate 100 (or the first substrate 100s), the side surface A200 of the second substrate 200s may protrude from the side surface A204 of the corresponding second film portion 204a, but it is not limited thereto.

However, in some other embodiments (not illustrated), in the normal direction Z of the first mother substrate 100 (or the first substrate 100s), the side surface A104 of the first film portion 104a may protrude from the side surface A100 of the corresponding first substrate 100s. In some other embodiments (not illustrated), in the normal direction Z of the first mother substrate 100 (or the first substrate 100s), the side surface A204 of the second film portion 204a may protrude from the side surface A200 of the corresponding second substrate 200s.

To summarize the above, in accordance with some embodiments of the present disclosure, the provided method for manufacturing an electronic device includes a half-cutting process to the mother substrate and/or a cutting process to the optical film after the half-cutting process so that a plurality of separated substrates with respective optical film formed thereon can be obtained. In some embodiments, the optical film is attached or disposed on the mother substrate and then cut into separated film portions that correspond to the separated substrates (chip cells). Therefore, there is no need to cut the optical film into separated ones in advance and then attached them to the separated substrates respectively. In some embodiments, the provided method for manufacturing an electronic device can be time-saving or improve the process efficiency.

Although some embodiments of the present disclosure and their advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps. In addition, each claim constitutes an individual embodiment, and the claimed scope of the present disclosure also includes the combinations of the claims and embodiments. The features of the various embodiments can be used in any combination as long as they do not depart from the spirit and scope of the present disclosure. The scope of protection of present disclosure is subject to the definition of the scope of the appended claims.

What is claimed is:

1. A method for manufacturing an electronic device, comprising:
providing a first mother substrate comprising a plurality of first substrate areas;
providing a second mother substrate disposed opposite to the first mother substrate, wherein the second mother substrate comprises a plurality of second substrate areas;
performing a first half-cutting step on the first mother substrate to produce a first crack to define the plurality of first substrate areas;
performing a second half-cutting step on the second mother substrate to produce a second crack to define the plurality of second substrate areas;
disposing a first optical film on the first mother substrate having the first crack, wherein the first optical film has a first cutting region corresponding to the first crack;
disposing a second optical film on the second mother substrate having the second crack, wherein the second optical film has a second cutting region corresponding to the second crack;
performing a first cutting step in the first cutting region of the first optical film; and
separating the plurality of first substrate areas to form a plurality of first substrates; and
separating the plurality of second substrate areas to form a plurality of second substrates.

2. The method for manufacturing an electronic device as claimed in claim 1, wherein the first crack comprises a plurality of through-holes.

3. The method for manufacturing an electronic device as claimed in claim 2, wherein a gap between the plurality of through-holes is in a range from 0.5 micrometers to 20 micrometers.

4. The method for manufacturing an electronic device as claimed in claim 2, wherein a width of one of the plurality of through-holes is in a range from 0.5 micrometers to 4 micrometers.

5. The method for manufacturing an electronic device as claimed in claim 1, wherein the first crack is formed by partially cutting the first mother substrate.

6. The method for manufacturing an electronic device as claimed in claim 5, wherein a ratio of a depth of the first crack to a thickness of the first mother substrate is in a range from 0.2 to 0.8.

7. The method for manufacturing an electronic device as claimed in claim 5, wherein a width of the first crack is in a range from 0.5 micrometers to 4 micrometers.

8. The method for manufacturing an electronic device as claimed in claim 1, wherein after performing the first cutting step, the first optical film is separated into a plurality of first film portions, and the plurality of first film portions are correspondingly disposed on the plurality of first substrates.

9. The method for manufacturing an electronic device as claimed in claim 8, wherein at least one of the plurality of first film portions has a penetration axis, and a first cross-section of the at least one of the plurality of first film portions that is non-parallel to the penetration axis has a convex-concave structure.

10. The method for manufacturing an electronic device as claimed in claim 9, wherein a roughness of the first cross-section of the at least one of the plurality of first film portions is greater than a roughness of a second cross-section of the at least one of the plurality of first film portions that is approximately parallel to the penetration axis.

11. The method for manufacturing an electronic device as claimed in claim 1, further comprising disposing a spacer element on the first mother substrate before performing the first half-cutting step, wherein after performing the first half-cutting step, the first crack overlaps with the spacer element in a normal direction of the first mother substrate.

12. The method for manufacturing an electronic device as claimed in claim 1, further comprising disposing a shielding element on the first mother substrate before performing the first half-cutting step, wherein after perform the first half-cutting step, the first crack overlaps with the shielding element) in a normal direction of the first mother substrate.

13. The method for manufacturing an electronic device as claimed in claim 5, wherein the first crack extends from a surface of the first mother substrate to a position within the first mother substrate.

14. The method for manufacturing an electronic device as claimed in claim 1, wherein a shape of one of the plurality of first substrates comprises a rectangle, a polygon, a curved edge shape or an irregular shape.

15. The method for manufacturing an electronic device as claimed in claim 1, wherein the first cutting step comprises a laser cutting process.

16. The method for manufacturing an electronic device as claimed in claim 1, wherein the first half-cutting step comprises a laser cutting process or a wheel cutting process.

17. The method for manufacturing an electronic device as claimed in claim 1, wherein after performing the first cutting step, the first optical film is separated into a plurality of first film portions, the plurality of first film portions are correspondingly disposed on the plurality of first substrates, and a side surface of at least one of the plurality of first film portions is aligned with a side surface of a corresponding one of the plurality of first substrates.

18. The method for manufacturing an electronic device as claimed in claim 1, further comprising:
performing a third cutting step on the second mother substrate to produce a third crack, wherein the third crack is adjacent to the second crack, and the third crack overlaps with an outer lead bonding area in a normal direction of the first mother substrate.

19. The method for manufacturing an electronic device as claimed in claim 1, wherein after performing the first cutting step, the first optical film is separated into a plurality of first film portions, the plurality of first film portions are correspondingly disposed on the plurality of first substrates, and a side surface of one of the plurality of first substrates protrudes from a side surface of a corresponding one of the plurality of first film portions.

* * * * *